United States Patent
Kawashima et al.

(10) Patent No.: US 9,716,072 B2
(45) Date of Patent: Jul. 25, 2017

(54) POWER SEMICONDUCTOR DEVICE AND METHOD OF MANUFACTURING THE SAME

(71) Applicant: Mitsubishi Electric Corporation, Tokyo (JP)

(72) Inventors: Hiroshi Kawashima, Tokyo (JP); Ken Sakamoto, Tokyo (JP); Taketoshi Shikano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/112,890

(22) PCT Filed: May 12, 2014

(86) PCT No.: PCT/JP2014/062608
§ 371 (c)(1),
(2) Date: Jul. 20, 2016

(87) PCT Pub. No.: WO2015/173862
PCT Pub. Date: Nov. 19, 2015

(65) Prior Publication Data
US 2016/0343644 A1 Nov. 24, 2016

(51) Int. Cl.
*H01L 23/495* (2006.01)
*H01L 21/50* (2006.01)
(Continued)

(52) U.S. Cl.
CPC ............ *H01L 24/49* (2013.01); *H01L 21/565* (2013.01); *H01L 23/4334* (2013.01);
(Continued)

(58) Field of Classification Search
CPC ............... H01L 23/49562; H01L 24/49; H01L 23/49551; H01L 21/565; H01L 23/3121; H01L 23/49555; H01L 21/4853
(Continued)

(56) References Cited

U.S. PATENT DOCUMENTS 7,166,926 B2 *   1/2007   Hayashi ................ H01L 21/565
                                                      257/676
7,675,148 B2 *   3/2010   Lim ..................... H01L 23/4334
                                                      257/676
(Continued)

FOREIGN PATENT DOCUMENTS

JP   2004-172239 A   6/2004
JP   2012-060105 A   3/2012
JP   2013-074035 A   4/2013

OTHER PUBLICATIONS

International Search Report issued in PCT/JP2014/062608; mailed Jul. 29, 2014.

*Primary Examiner* — Luan C Thai
(74) *Attorney, Agent, or Firm* — Studebaker & Brackett PC

(57) ABSTRACT

A power semiconductor element is fixed on a die pad of the lead frame. A metal plate is bonded to a lower surface of the die pad via an insulating film. The inner lead etc. are disposed in a cavity between a lower mold and an upper mold and are encapsulated with an encapsulation resin. The lower mold has a stepped portion provided in a bottom surface of the cavity below the inner lead. A height of an upper surface of the stepped portion is larger than a height of an upper surface of the power semiconductor element disposed in the cavity. When an encapsulation resin is injected into the cavity, a lower surface of the metal plate is in contact with the bottom surface of the cavity, and the encapsulation resin flows downward from above the stepped portion toward the upper surface of the power semiconductor element.

11 Claims, 10 Drawing Sheets

(51) Int. Cl.
*H01L 23/00* (2006.01)
*H01L 21/56* (2006.01)
*H01L 23/433* (2006.01)
*H01L 23/31* (2006.01)

(52) U.S. Cl.
CPC .. *H01L 23/49537* (2013.01); *H01L 23/49551* (2013.01); *H01L 23/49562* (2013.01); *H01L 23/49575* (2013.01); *H01L 23/3107* (2013.01); *H01L 24/45* (2013.01); *H01L 2224/45124* (2013.01); *H01L 2224/45144* (2013.01); *H01L 2224/45147* (2013.01); *H01L 2224/48091* (2013.01); *H01L 2224/48137* (2013.01); *H01L 2224/48257* (2013.01); *H01L 2224/49171* (2013.01); *H01L 2224/49505* (2013.01); *H01L 2924/13055* (2013.01); *H01L 2924/181* (2013.01); *H01L 2924/1815* (2013.01)

(58) Field of Classification Search
USPC .......................................... 257/676; 438/124
See application file for complete search history.

(56) References Cited

U.S. PATENT DOCUMENTS

| | | | | |
|---|---|---|---|---|
| 7,808,085 B2* | 10/2010 | Ozaki | ................... | H01L 21/565 |
| | | | | 257/100 |
| 8,598,693 B2* | 12/2013 | Nishikawa | ............ | H01L 21/565 |
| | | | | 257/670 |
| 2012/0032316 A1 | 2/2012 | Nishikawa | | |
| 2012/0206196 A1* | 8/2012 | Kato | .................... | H02M 7/217 |
| | | | | 327/564 |

* cited by examiner

RESIN FLOW DIRECTION

RESIN FLOW DIRECTION

RESIN FLOW DIRECTION

POWER SEMICONDUCTOR DEVICE AND METHOD OF MANUFACTURING THE SAME

FIELD

The present invention relates to a power semiconductor device having a power semiconductor element encapsulated with an encapsulation resin and a method of manufacturing the same.

BACKGROUND

Power semiconductor devices among semiconductor devices are being used to control or rectify comparatively high electric power in vehicles such as railroad cars, hybrid vehicles and electric vehicles, home appliances, industrial machines, etc. Since the power semiconductor element develops heat during use, there is a need for the power semiconductor device to have the ability to dissipate heat from the element. Also, because a high voltage of several hundred volts or higher is applied, insulation from the outside of the device is required.

An intelligent power module (IPM) is a module in which a power semiconductor element and a control semiconductor element are combined integrally with each other. If a lead frame is used as wiring material, the power semiconductor element and the control semiconductor element are ordinarily mounted on a die pad physically isolated and are thereafter electrically connected to each other by thin metal wires or the like. Since a large current is caused to flow through the power semiconductor element, a large amount of heat is generated and there is a demand for imparting a heat dissipation capacity to the module.

As a heat dissipating structure, a structure is known in which a metal plate is heat-pressure-bonded to back surfaces of a die pad with high-heat-dissipation insulating film interposed therebetween and these members are molded by transfer molding (see, for example, PTL 1).

CITATION LIST

Patent Literature

[PTL 1] JP 2004-172239 A

SUMMARY

Technical Problem

An encapsulation resin used in transfer molding has a thermosetting property, is temporarily molten by heat and is thereafter set by chemical reaction. Therefore, injection must be completed in a restricted time period and there is a need to set a high injection speed for a large-area package in particular. In the case of injection at an increased speed, the flow resistance acting on a bent portion connecting the die pad and an inner lead is increased and the die pad receives a force by which the die pad can be torn off from the insulating film. This causes instability of the bonding between the die pad and the insulating film and a reduction in dielectric withstand voltage. Also, the surface pressure on the power semiconductor element is reduced and the strength of bonding between the power semiconductor element and the die pad is reduced, resulting in a reduction in yield.

The entire surface of the insulating film is not bonded to the die pads. For reasons relating to wiring, some portions of the insulating film including a peripheral portion or other portions of the insulating film are not bonded. A warp due to the difference in thermal expansion coefficient between the insulating film and the metal frame is caused in the peripheral portion not bonded. The insulating film is ordinarily a resin film having a thermal expansion coefficient larger than those of metals. Therefore the warp has a downward convex shape. When the warped metal plate is placed on a lower mold in transfer molding, some portion of the metal plate is separate from the mold. When the resin is injected in this state, the encapsulation resin flowing horizontally enters the gap between the lower surface of the metal plate and the lower mold to produce a resin burr. If the amount of resin burr is large, the heat dissipation effect is reduced.

The present invention has been achieved to solve the above-described problem, and an object of the present invention is to provide a power semiconductor device capable of improving the yield and the heat dissipation and a method of manufacturing the same.

Solution to Problem

A method of manufacturing a power semiconductor device according to the present invention includes: preparing a lead frame having an inner lead, an outer lead connected to the inner lead, a die pad disposed at a position lower than that of the inner lead, and a bent portion connecting the inner lead and the die pad; fixing a power semiconductor element on the die pad; bonding a metal plate to a lower surface of the die pad via an insulating film; and encapsulating the inner lead, the die pad, the power semiconductor element, the insulating film and metal plate with an encapsulation resin in a cavity between a lower mold and an upper mold, wherein the lower mold has a stepped portion provided in a bottom surface of the cavity below the inner lead, a height of an upper surface of the stepped portion is larger than a height of an upper surface of the power semiconductor element disposed in the cavity, and when the encapsulation resin is injected into the cavity, a lower surface of the metal plate is in contact with the bottom surface of the cavity, and the encapsulation resin is caused to flow downward from above the stepped portion toward the upper surface of the power semiconductor element.

Advantageous Effects of Invention

In the present invention, the encapsulation resin is caused to flow downward from above the stepped portion toward the upper surface of the power semiconductor element, thereby pressing the die pad downward. Also, the flow resistance to the bent portion is reduced as a result of the provision of the stepped portion. The bonding between the insulating film and the die pad is thereby stabilized, thus improving the dielectric withstand voltage. Further, the power semiconductor element is also pressed and the surface pressure thereon is increased, thereby improving the strength of bonding between the power semiconductor element and the die pad, thus achieving an improvement in yield. Also, the flow of the encapsulation resin in the horizontal direction before the encapsulation resin reaches the metal plate during resin injection is reduced as a result of the provision of the stepped portion, so that the encapsulation resin cannot easily enter the gap between the metal plate and the lower mold. The insulating film and the metal plate are also pressed downward to suppress the warp of the metal plate, thereby making it further difficult for the encapsulation resin to enter the gap between the metal plate and

DESCRIPTION OF EMBODIMENTS

A power semiconductor device and a method of manufacturing the same according to the embodiments of the present invention will be described with reference to the drawings. The same components will be denoted by the same symbols, and the repeated description thereof may be omitted.

Embodiment 1

Figure 1:
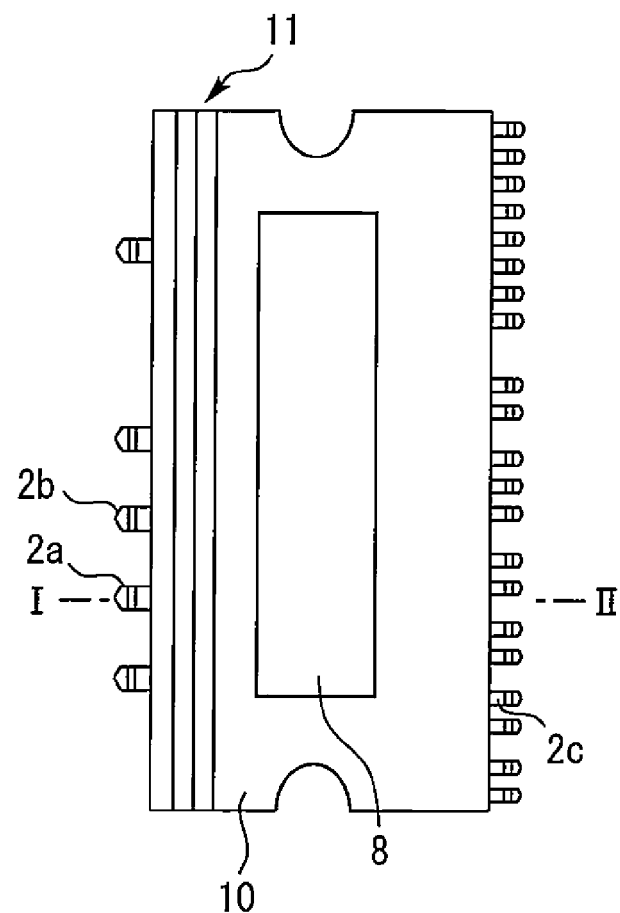
FIG. 1 is a bottom view of a power semiconductor device according to Embodiment 1 of the present invention.
Figure 2:
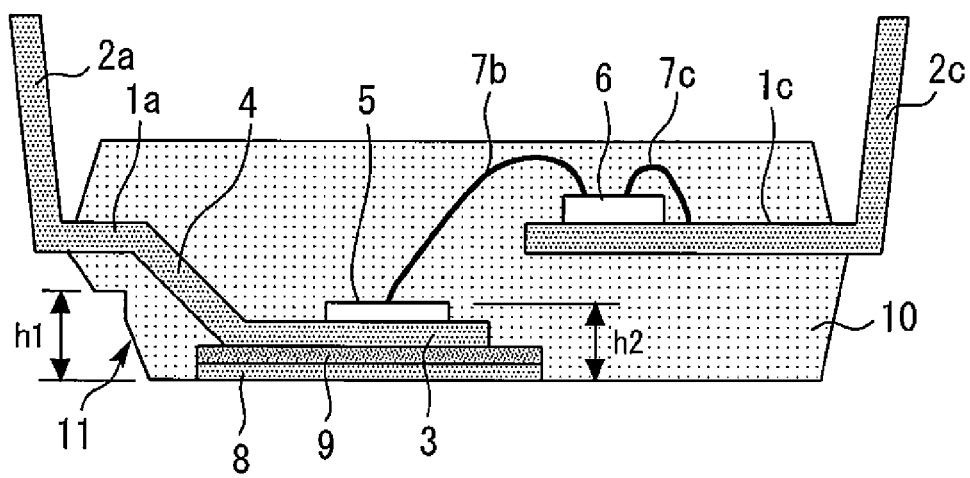
FIG. 2 is a sectional view taken along line I-II in FIG. 1.
Figure 3:
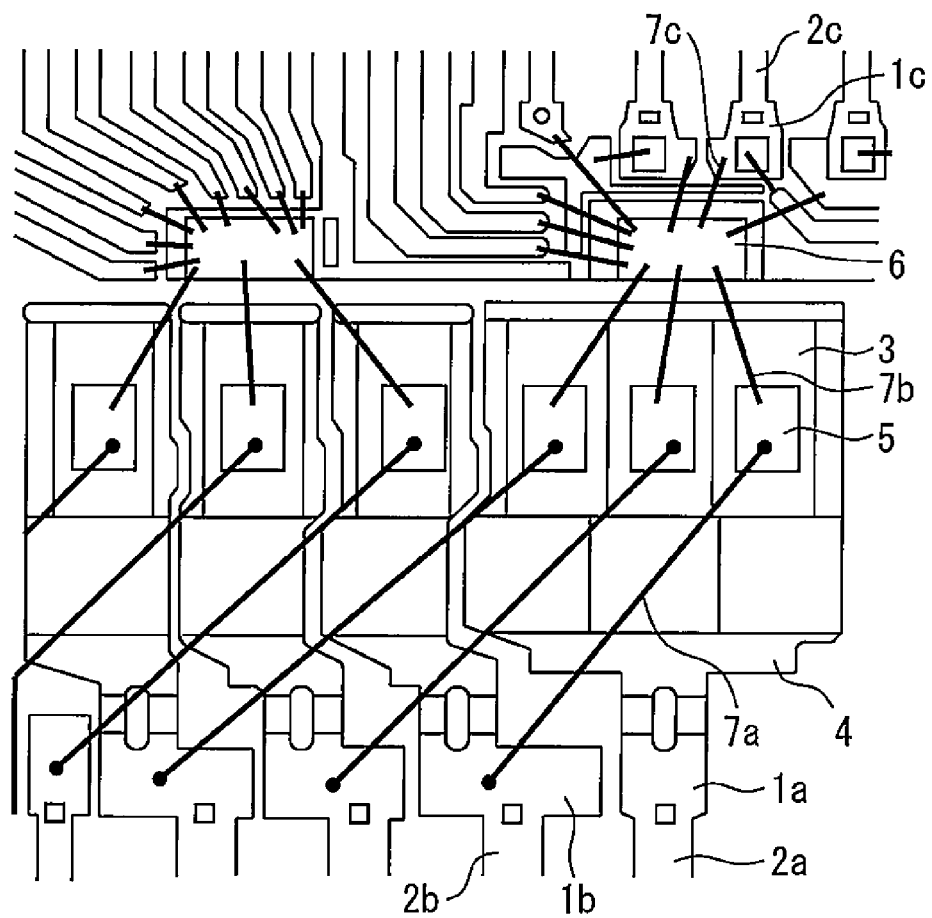
FIG. 3 is a top view showing internal portions of the power semiconductor device according to Embodiment 1 of the present invention.
Figure 4:
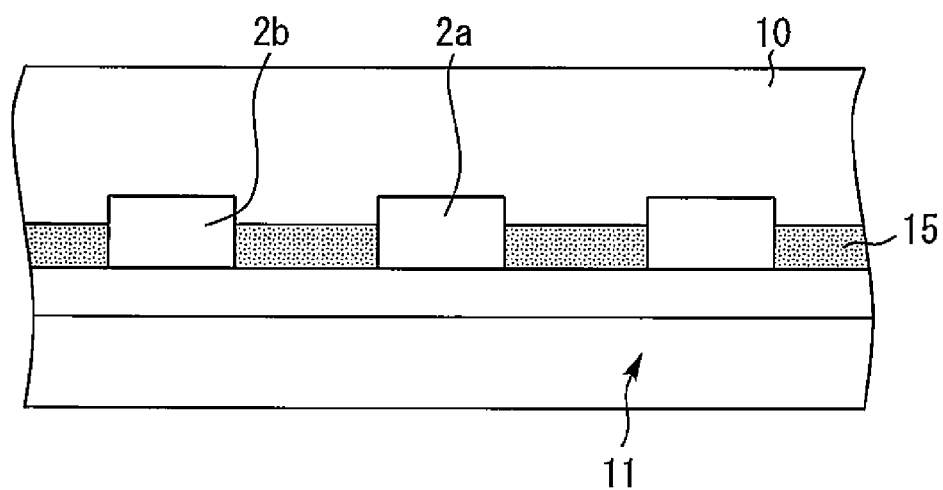
FIG. 4 is a side view of the power semiconductor device according to Embodiment 1 of the present invention.

FIG. 1 is a bottom view of a power semiconductor device according to Embodiment 1 of the present invention. FIG. 2 is a sectional view taken along line I-II in FIG. 1. FIG. 3 is a top view showing internal portions of the power semiconductor device according to Embodiment 1 of the present invention. FIG. 4 is a side view of the power semiconductor device according to Embodiment 1 of the present invention. This power semiconductor device is a DIP-type package.

A lead frame has inner leads $1a$, $1b$, and $1c$, outer leads $2a$, $2b$, and $2c$ connected to the inner leads $1a$, $1b$, and $1c$, respectively, a die pad 3 disposed at a position lower than that of the inner lead $1a$, and a bent portion 4 connecting the inner lead $1a$ and the die pad 3. The inner leads $1a$ and $1b$ are power leads while the inner lead is a control inner lead. The outer leads $2a$ and $2b$ are power leads while the outer lead $2c$ is a control outer lead.

A power semiconductor element 5 is fixed on the die pad 3 by using Pb-free solder. The power semiconductor element 5 is a reverse conductive insulated gate bipolar transistor (RCIGBT). A control semiconductor element 6 is fixed on the inner lead $1c$ by using an electrically conductive adhesive. For joining between the power semiconductor element 5 and the die pad 3, an electrically conductive joining material such as the electrically conductive adhesive, not limited to solder, can be used.

An emitter electrode and a gate electrode are provided on an upper surface of the power semiconductor element 5. An Al wire $7a$ connects the emitter electrode and the inner lead $1b$; an Au wire $7b$ connects the gate electrode and the control semiconductor element 6; and an Au wire $7c$ connects the control semiconductor element 6 and the inner lead $1c$. A Cu wire may be used instead of the Al wire or the Au wire.

A metal plate 8 is fixed to a lower surface of the die pad 3, with a high-heat-dissipation insulating film 9 interposed therebetween. The metal plate 8 is formed of material such as Cu or Al having a high heat dissipation characteristic. The material of the insulating film 9 is a mixture of a resin and a thermally conductive filler. Any of thermoplastic and thermosetting resins suffices as the resin of the insulating film 9 if it is capable of bonding. A material such as $SiO_2$, $Al_2O_3$ or BN having both an electrically insulating property and a high thermal conductivity may suffice as the filler.

The inner leads $1a$, $1b$, and $1c$, the die pad 3, the power semiconductor element 5, the insulating film 9, the Al wire $7a$, the Au wires $7b$ and $7c$ and the metal plate 8 are encapsulated with an encapsulation resin 10. A lower surface of the metal plate 8 is exposed from a lower surface of the encapsulation resin 10. The outer leads $2a$, $2b$, and $2c$ project respectively from opposite ends of the device. A stepped portion 11 is provided in a lower surface of the encapsulation resin 10 below the inner leads $1a$ and $1b$. The height h1 of the lower surface of the encapsulation resin 10 in the stepped portion 11 is larger than the height h2 of the upper surface of the power semiconductor element 5.

Figure 5:
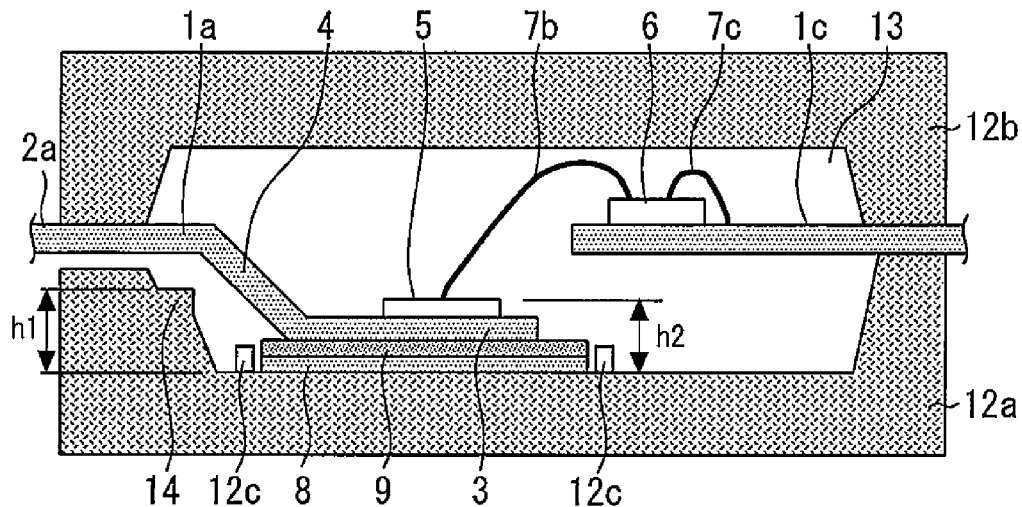
FIG. 5 is a sectional view showing the method of manufacturing the power semiconductor device according to Embodiment 1 of the present invention.
Figure 6:
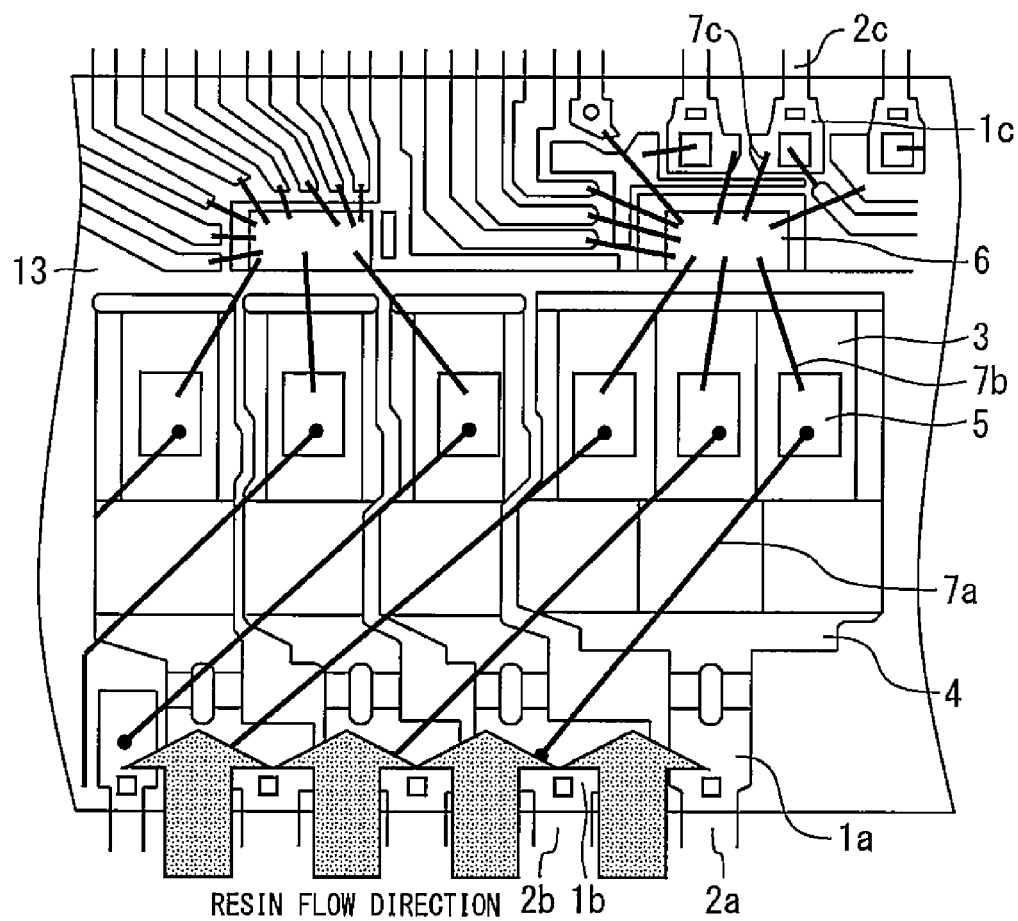
FIG. 6 is a top view showing the method of manufacturing the power semiconductor device according to Embodiment 1 of the present invention.

A method of manufacturing the power semiconductor device according to the present embodiment will subsequently be described. FIG. 5 is a sectional view showing the method of manufacturing the power semiconductor device according to Embodiment 1 of the present invention. FIG. 6 is a top view showing the method of manufacturing the power semiconductor device according to Embodiment 1 of the present invention.

First, the lead frame is prepared. The power semiconductor element 5 is fixed on the die pad 3 of the lead frame by using Pb-free solder, and the control semiconductor element 6 is fixed on the inner lead $1c$ by using an electrically conductive adhesive. The emitter electrode of the power semiconductor element 5 and the inner lead $1a$ are connected to each other by the Al wire $7a$; the gate electrode of the power semiconductor element 5 and the control semiconductor element 6 are connected to each other by the Au wire 7b; and the control semiconductor element 6 and the inner lead 1c are connected to each other by the Au wire 7c.

The insulating film 9 in a half-set state with the metal plate 8 attached thereto in advance is temporarily bonded to the lower surface of the die pad 3 by heat-pressure bonding. "Half-set state" refers to a state in which the material, which is solid at ordinary temperature, is in the course of setting toward a completely set state after being temporarily molten at a high temperature but is not completely set.

Next, as shown in FIGS. 5 and 6, the members including the inner leads 1a, 1b, and 1c, the die pad 3, the power semiconductor element 5, the Al wire 7a, the Au wires 7b and 7c, the metal plate 8 and the insulating film 9 are disposed in a cavity 13 between lower mold 12a and an upper mold 12b. At this time, the metal plate 8 and the insulating film 9 are positioned on a bottom surface of the cavity 13 by projecting movable pins 12c for positioning from the lower mold 12a. After mold clamping, the encapsulation resin 10 is injected from an injection gate between the outer leads 2a and 2b into the cavity 13, thus encapsulating with the encapsulation resin 10 (transfer molding). By the pressure of injection of the encapsulation resin 10, the insulating film 9 is completely heat-pressure-bonded while the encapsulation body is formed.

In resin injection, the encapsulation resin 10 is caused to flow from the inner lead 1a/1b side toward the control inner lead 1c side with the aim of reducing the flow resistance of the encapsulation resin 10 against the Au wire 7c on the control inner lead 1c. During injection, the movable pins 12c for positioning are drawn off and a hydrostatic pressure is applied in the mold. After the encapsulation resin 10 is set, the molding is released by removing the molds.

The lower mold 12a has a stepped portion 14 provided in a bottom surface of the cavity 13 below the inner lead 1a. The height h1 of an upper surface of the stepped portion 14 is larger than the height h2 of the upper surface of the power semiconductor element 5 disposed in the cavity 13. When the encapsulation resin 10 is injected into the cavity 13, the lower surface of the metal plate 8 is in contact with the bottom surface of the cavity 13, and the encapsulation resin 10 is caused to flow downward from above the stepped portion 14 toward the upper surface of the power semiconductor element 5.

The encapsulation resin 10 remaining at the injection gate between the outer leads 2a and 2b after transfer molding is cut off from the encapsulated body. A gate resin removal trace 15 having a surface roughness (Rz) equal to or higher than 20 μm, such as shown in FIG. 4, remains in a side surface of the encapsulated body. Thereafter, postprocessing such as preservative treatment is performed on the outer leads 2a, 2b, and 2c, and the encapsulated body is worked into the predetermined external shape.

Figure 7:
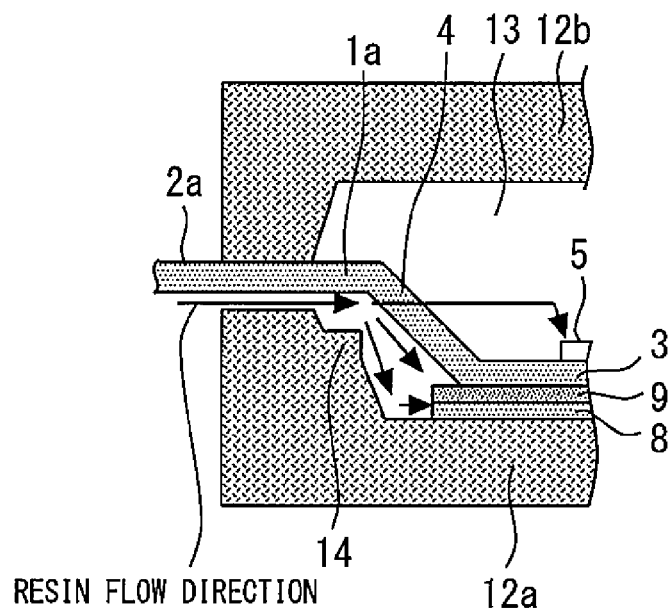
FIG. 7 is an enlarged sectional view showing the method of manufacturing the power semiconductor device according to Embodiment 1 of the present invention.
Figure 8:
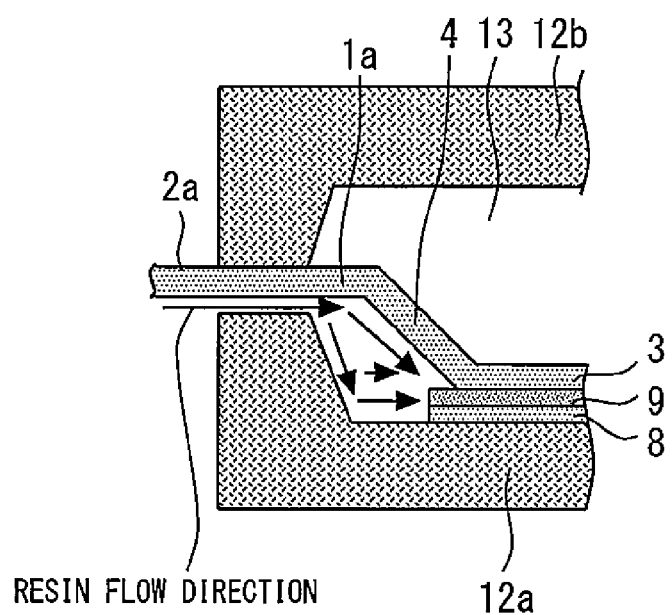
FIG. 8 is an enlarged sectional view showing the method of manufacturing a power semiconductor device according to a comparative example.

The effects of the present embodiment will be described in comparison with a comparative example. FIG. 7 is an enlarged sectional view showing the method of manufacturing the power semiconductor device according to Embodiment 1 of the present invention. FIG. 8 is an enlarged sectional view showing the method of manufacturing a power semiconductor device according to a comparative example. In the present embodiment, the stepped portion 14 is provided in the bottom surface of the cavity 13 below the inner lead 1a. In the comparative example, the stepped portion 14 is not provided.

In the comparative example, because of the absence of the stepped portion 14, the injected encapsulation resin 10 flows in the horizontal direction (planer direction) with respect to the insulating film 9 and the die pad 3. Accordingly, the bent portion 4 receives an upward flow resistance from the encapsulation resin 10, so that a force by which the die pad 3 can be torn off from the insulating film 9 is continuously applied during resin injection to cause instability of the bonding between the insulating film 9 and the die pad 3. Also, the surface pressure on the power semiconductor element 5 is reduced and the strength of bonding between the power semiconductor element 5 and the die pad 3 is reduced. The encapsulation resin 10 flowing horizontally enters the gap between the lower surface of the metal plate 8 and the lower mold to produce a resin burr.

On the other hand, in the present embodiment, the encapsulation resin 10 is caused to flow downward from above the stepped portion 14 toward the upper surface of the power semiconductor element 5, thereby pressing the die pad 3 downward. Also, the flow resistance to the bent portion 4 is reduced as a result of the provision of the stepped portion 14. The bonding between the insulating film 9 and the die pad 3 is thereby stabilized, thus improving the dielectric withstand voltage. Further, the power semiconductor element 5 is also pressed and the surface pressure thereon is increased, thereby improving the strength of bonding between the power semiconductor element 5 and the die pad 3, thus achieving an improvement in yield.

Also, the flow of the encapsulation resin 10 in the horizontal direction before the encapsulation resin 10 reaches the metal plate 8 during resin injection is reduced as a result of the provision of the stepped portion 14, so that the encapsulation resin 10 cannot easily enter the gap between the metal plate 8 and the lower mold 12a. The insulating film 9 and the metal plate 8 are also pressed downward to suppress the warp of the metal plate 8, thereby making it further difficult for the encapsulation resin 10 to enter the gap between the metal plate 8 and the lower mold 12a. As a result, the generation of a resin burr along the lower surface of the metal plate 8 is inhibited. The heat dissipation is improved since no resin burr intervenes when an external cooling device such as a finned one is attached.

Also, in the present embodiment, the stepped portion 11 is provided in the lower surface of the encapsulation resin 10 below the inner lead 1a. The creeping distance between the outer leads 2a and 2b and the metal plate 8 is increased by the stepped portion 11, thereby enabling the power semiconductor device to be increased in size.

In Embodiment 1, there is a need to space the stepped portion 14 and the metal plate 8 apart from each other by a certain distance (0.5 to 3 mm) in order to secure the region where the movable pins 12c are provided in the lower mold 12a. It is, therefore, necessary that the manufactured device have a bottom surface of a certain width formed of the encapsulation resin 10 between the stepped portion 11 and the metal plate 8.

Embodiment 2

Figure 9:
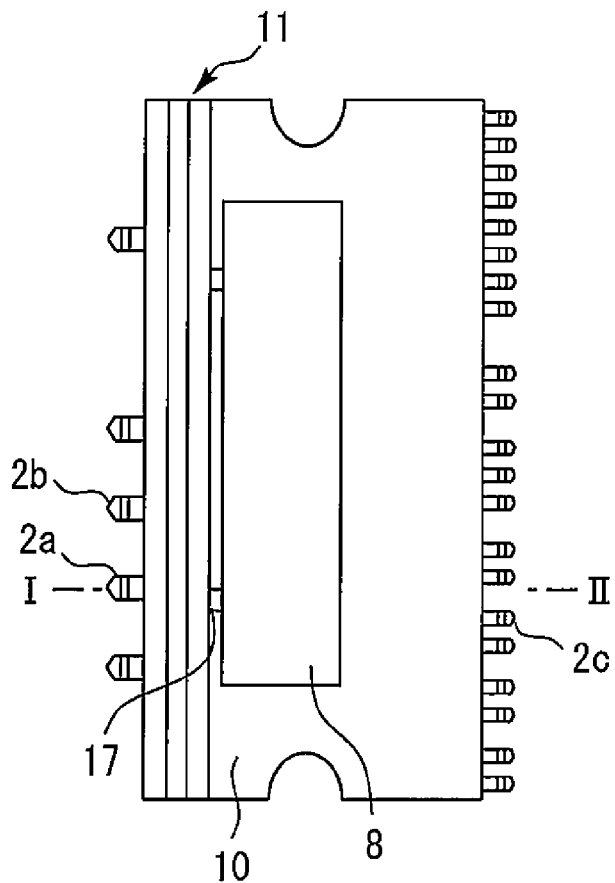
FIG. 9 is a bottom view of a power semiconductor device according to Embodiment 2 of the present invention.
Figure 10:
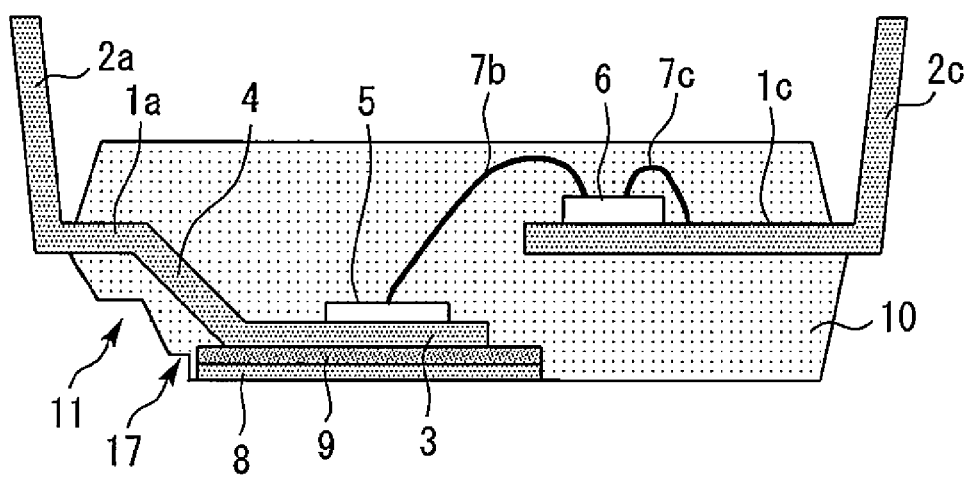
FIG. 10 is a sectional view taken along line I-II in FIG. 9.
Figure 11:
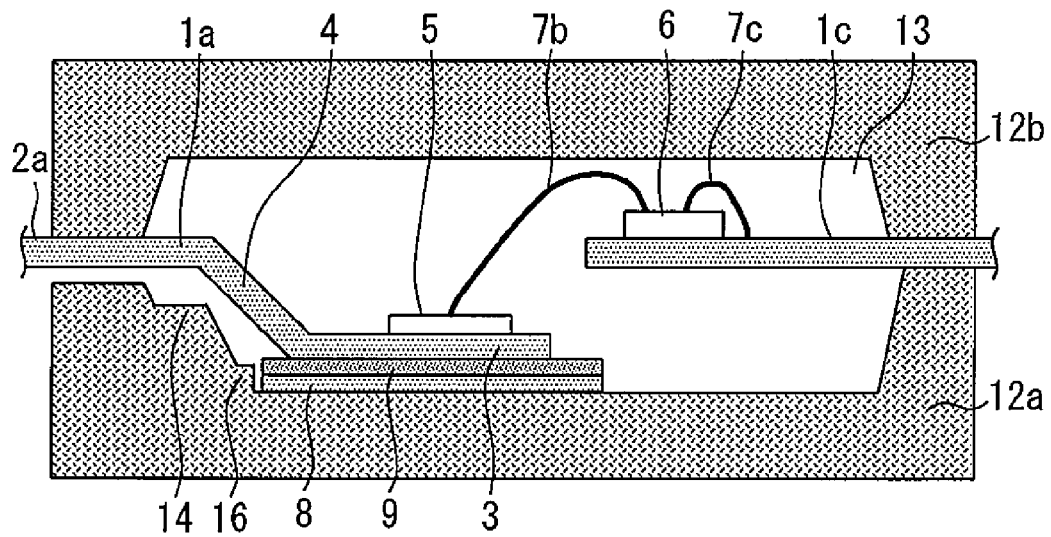
FIG. 11 is a sectional view showing a method of manufacturing the power semiconductor device according to Embodiment 2 of the present invention.

FIG. 9 is a bottom view of a power semiconductor device according to Embodiment 2 of the present invention. FIG. 10 is a sectional view taken along line I-II in FIG. 9. FIG. 11 is a sectional view showing a method of manufacturing the power semiconductor device according to Embodiment 2 of the present invention.

Two projections 6 lower in height than the stepped portion 14 are provided on the bottom surface of the cavity 13 between the stepped portion 14 and the metal plate 8. By transferring the projections 16 of the lower mold 12a, two depressions 17 shallower in depth than the stepped portion 11 are provided in the lower surface of the encapsulation resin 10 between the stepped portion 11 and the metal plate 8. It is desirable that the height of the depressions 7 be smaller than the total thickness of the metal plate 8 and the insulating film 9.

The metal plate 8 can be placed by being positioned along the projections 16 of the lower mold 12a. The movable pins 12c for positioning used in Embodiment 1 can therefore be removed. Since the region on the lower mold 12a where the movable pins 12c are provided can be removed, the width of the bottom surface of the encapsulation resin 10 can be reduced and the power semiconductor device can be made smaller in size.

Since the projections 16 enable further reducing the spacing between a side surface of the metal plate 8 and the lower mold 12a, the flow resistance to the bent portion 4 is further reduced and the bonding between the insulating film 9 and the die pad 3 is further stabilized. Also, it becomes further difficult for the encapsulation resin 10 to enter the gap between the lower surface of the metal plate 8 and the bottom surface of the lower mold 12a.

If the spacing between the side surface of the metal plate 8 and the stepped portion 14 of the lower mold 12a varies from place to place, the flow in the horizontal direction to the metal plate 8 is not uniform; the way a resin burr is produced varies. It is, therefore, preferable to provide two or more projections 16. When the metal plate 8 and the insulating film 9 are placed on the lower mold 12a, the projections 16 enable the metal plate 8 and the insulating film 9 to be stably positioned and fixed without being rotated. As a result, the spacing between the side surface of the metal plate 8 and the stepped portion 14 of the lower mold 12a is made uniform and manufacturing variations are therefore reduced. In a case where two or more projections 16 are provided, two or more depressions 17 are provided in the lower surface of the encapsulation resin 10 in the manufactured device.

In Embodiment 2, the region on the lower mold 12a where the movable pins 12c are to be provided can be removed. The width of the bottom surface of the encapsulation resin 10 in the manufactured device can therefore be reduced, thus enabling the product to be made smaller in size.

Embodiment 3

Figure 12:
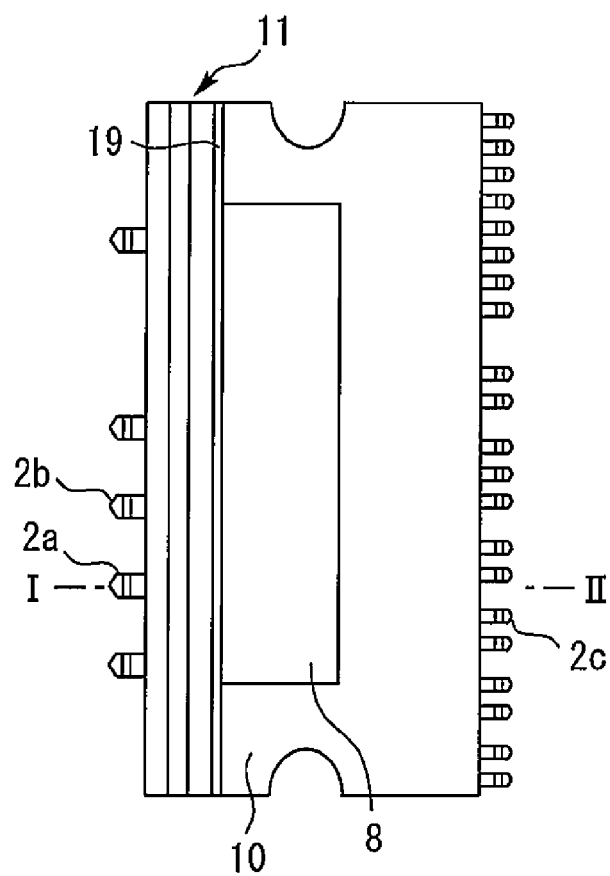
FIG. 12 is a bottom view of a power semiconductor device according to Embodiment 3 of the present invention.
Figure 13:
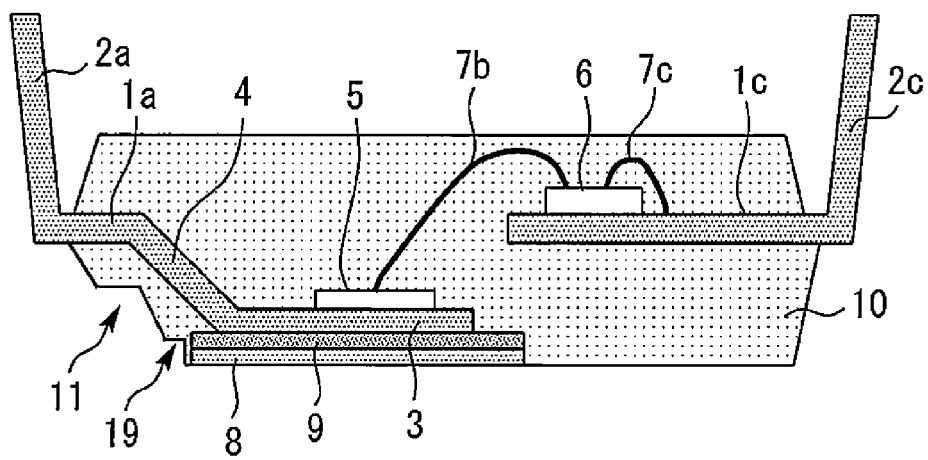
FIG. 13 is a sectional view taken along line I-II in FIG. 12.
Figure 14:
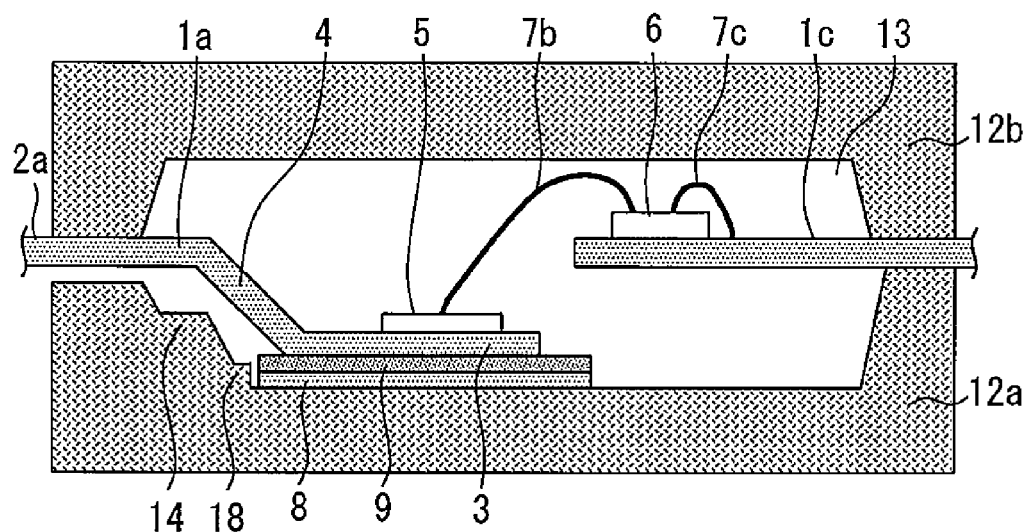
FIG. 14 is a sectional view showing a method of manufacturing the power semiconductor device according to Embodiment 3 of the present invention.

FIG. 12 is a bottom view of a power semiconductor device according to Embodiment 3 of the present invention. FIG. 13 is a sectional view taken along line I-II in FIG. 12. FIG. 14 is a sectional view showing a method of manufacturing the power semiconductor device according to Embodiment 3 of the present invention.

A small stepped portion 18 lower in height than the stepped portion 14 is provided in the bottom surface of the cavity 13 between the stepped portion 11 and the metal plate 8 instead of the projections 16 in Embodiment 2. By transferring the small stepped portion 18 of the lower mold 12a, a small stepped portion 19 shallower in depth than the stepped portion 11 are provided in the lower surface of the encapsulation resin 10 between the stepped portion 11 and the metal plate 8. The small stepped portion 18 is simpler in structure than the depressions 17 and has a rectilinear shape, such that the mold is easier to clean and is improved in maintainability. It is desirable that the height of the small stepped portion 18 be smaller than the total thickness of the metal plate 8 and the insulating film 9.

Figure 15:
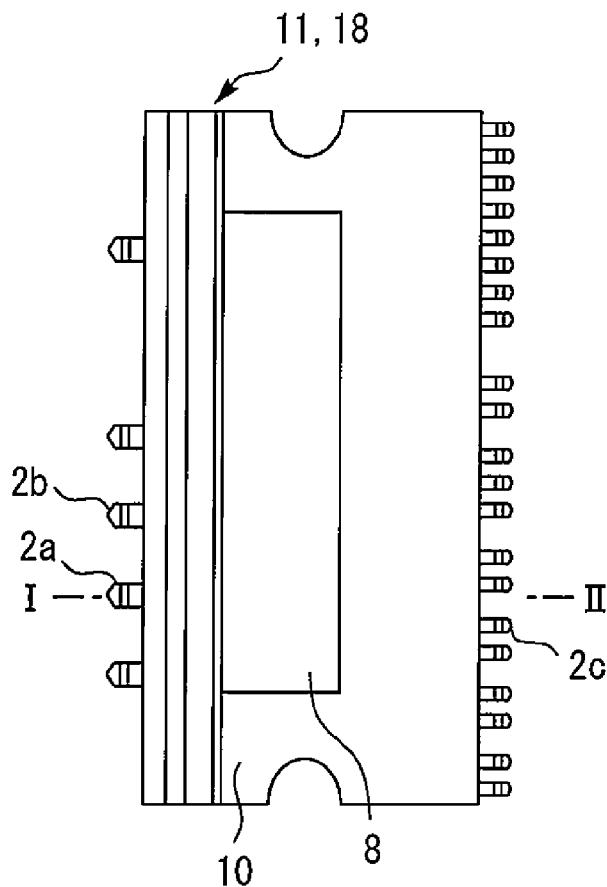
FIG. 15 is a bottom view of a modified example of the power semiconductor device according to Embodiment 3 of the present invention.
Figure 16:
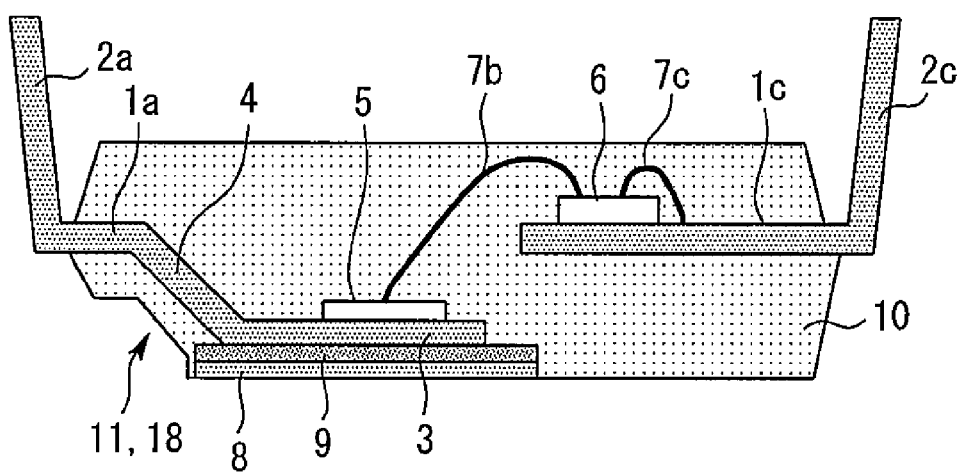
FIG. 16 is a sectional view taken along line I-II in FIG. 15.

FIG. 15 is a bottom view of a modified example of the power semiconductor device according to Embodiment 3 of the present invention. FIG. 16 is a sectional view taken along line I-II in FIG. 15. The slanting surfaces of the stepped portion 11 and the small stepped portion 18 are connected to each other to form one slope as a whole, and this slope is extended to a position in the vicinity of the metal plate 8. The advantage of Embodiment 3 can also be obtained in this case.

Embodiment 4

Figure 17:
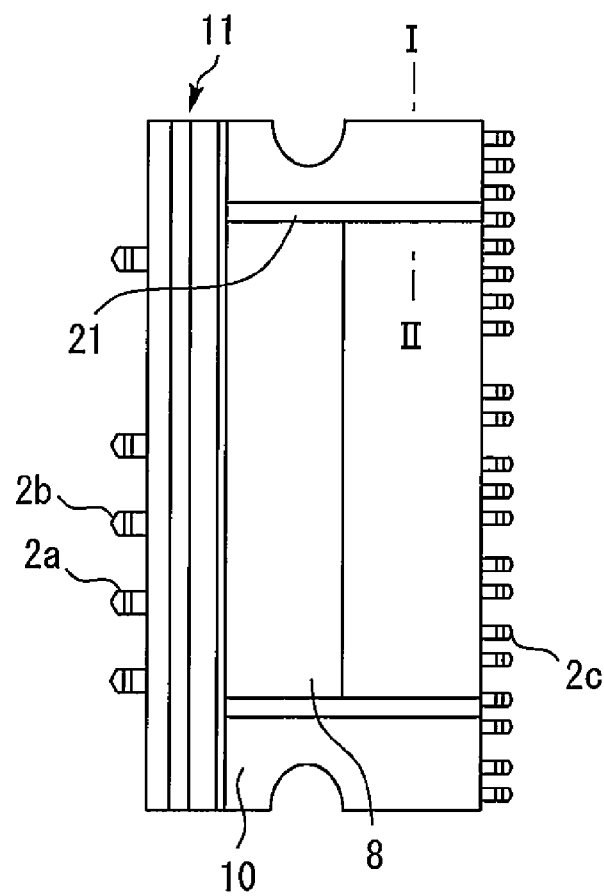
FIG. 17 is a bottom view of a power semiconductor device according to Embodiment 4 of the present invention.
Figure 18:
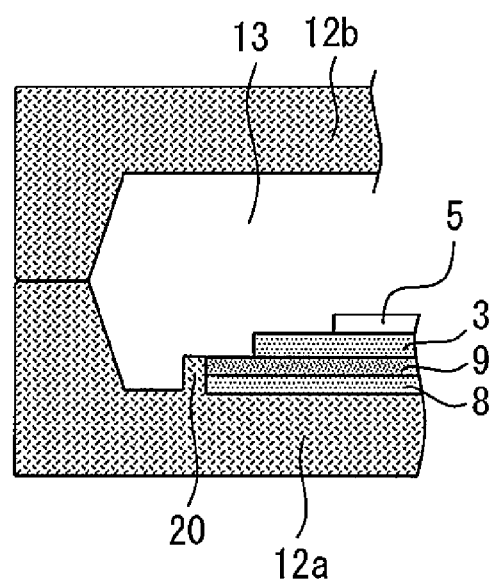
FIG. 18 is a sectional view showing a method of manufacturing the power semiconductor device according to Embodiment 4 of the present invention.

FIG. 17 is a bottom view of a power semiconductor device according to Embodiment 4 of the present invention. FIG. 18 is a sectional view showing a method of manufacturing the power semiconductor device according to Embodiment 4 of the present invention. FIG. 18 corresponds to a section of the device taken along line I-II in FIG. 17.

A stepped portion 11 is provided along the longer side of the metal plate 8, as is that in Embodiment 1. In addition, a projection 20 is provided on the bottom surface of the cavity 13 in the lower mold 12a along the shorter sides of the metal plate 8. By transferring the projection 20 of the lower mold 12a, a recess 21 is provided in the lower surface of the encapsulation resin 10 along the shorter side of the metal plate 8 in the vicinity of a screw hole.

The flow of the encapsulation resin 10 in the horizontal direction is also reduced at the shorter side by the projection 20, so that the generation of a resin burr is also inhibited with respect to a warp in a direction along the shorter side of the metal plate 8. It is desirable that the height of the projection 20 (the depth of the recess 21) be larger than the thickness of the metal plate 8.

Embodiment 5

Figure 19:
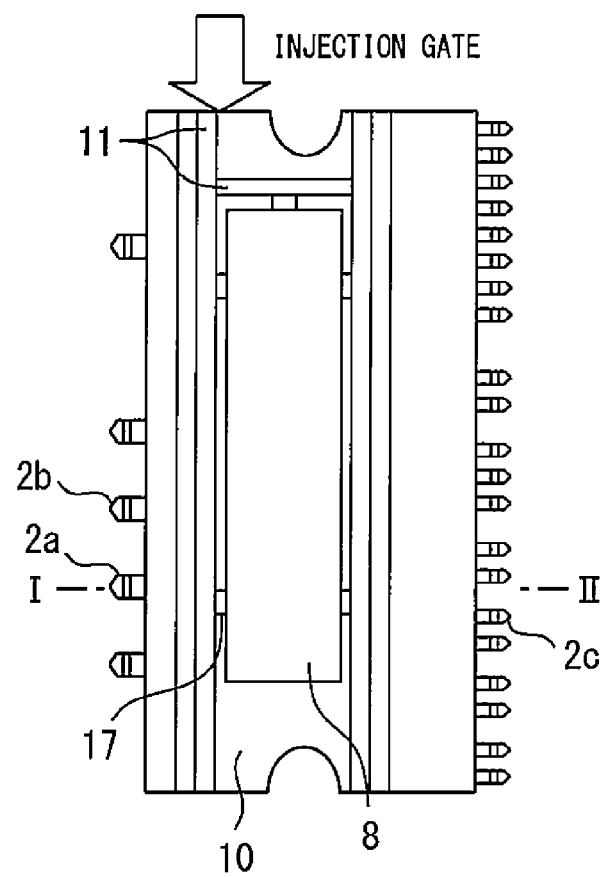
FIG. 19 is a bottom view of a power semiconductor device according to Embodiment 5 of the present invention.
Figure 20:
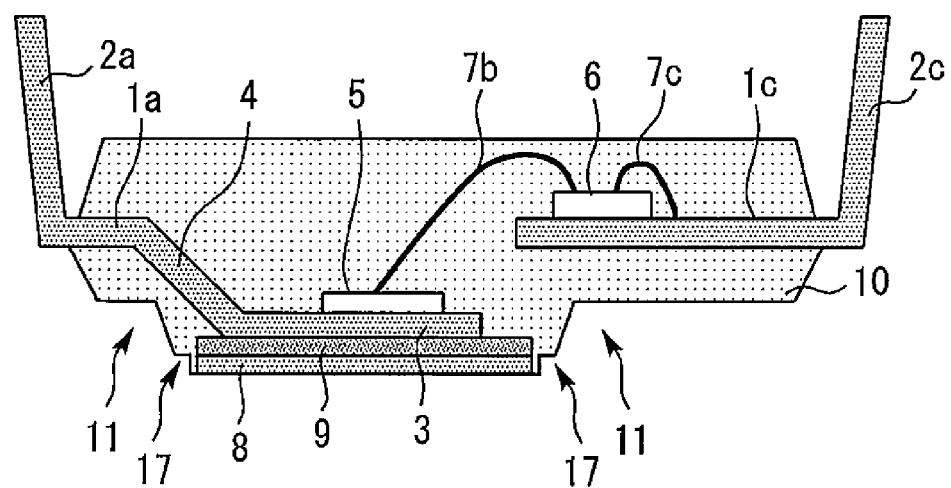
FIG. 20 is a sectional view taken along line I-II in FIG. 19.

FIG. 19 is a bottom view of a power semiconductor device according to Embodiment 5 of the present invention. FIG. 20 is a sectional view taken along line I-II in FIG. 19. In the present embodiment, a stepped portion 14 similar to that in Embodiment 1 for example is provided so as to surround the periphery of the metal plate 8. By transferring the stepped portion 14 of the lower mold 12a, the stepped portion 11 is provided in the lower surface of the encapsulation resin 10 so as to surround the periphery of the metal plate 8. A resin injection gate is provided at a shorter side of the metal plate 8. Also in a case where a resin injection gate is provided in a direction different from the direction of the power lead side as described above, stabilization of the bonding between the insulating film 9 and the die pad 3 and inhibition of the production of a resin burr on the back surface of the metal plate can be achieved by providing the stepped portion 14 in such a way that the stepped portion 14 surrounds the periphery of the metal plate 8.

The power semiconductor element 5 is not limited to the one formed of silicon. The power semiconductor element 5 may be formed of a wide-bandgap semiconductor having a bandgap larger than that of silicon. The wide-bandgap semiconductor is, for example silicon carbide, a gallium nitride-based material or diamond. The power semiconductor element 5 formed of such a wide-bandgap semiconductor is higher in withstand voltage characteristic and in allowable current density and can therefore be made smaller in size. By using the element made smaller in size, the power semiconductor device incorporating the element can also be made smaller in size. Since the heat resistance of the element is high, heat radiating fins of a heat sink can be reduced in size and a water cooling part can be replaced with an air cooling part, thus enabling the semiconductor module to be further reduced in size. Also, since the element has a reduced power loss and high efficiency, the efficiency of the power semiconductor device can be improved.

REFERENCE SIGNS LIST 1a inner lead, 2a outer lead, 3 die pad, 4 bent portion, 5 power semiconductor element, 8 metal plate, 9 insulating film, 10 encapsulation resin, 12*a* lower mold, 12*b* upper mold, 13 cavity, 14 stepped portion, 16 projection, 17 depression, 18 small stepped portion, 19 small stepped portion, 20 projection, 21 recess

The invention claimed is:

1. A method of manufacturing a power semiconductor device comprising:
preparing a lead frame having an inner lead, an outer lead connected to the inner lead, a die pad disposed at a position lower than that of the inner lead, and a bent portion connecting the inner lead and the die pad;
fixing a power semiconductor element on the die pad;
bonding a metal plate to a lower surface of the die pad via an insulating film; and
encapsulating the inner lead, the die pad, the power semiconductor element, the insulating film and metal plate with an encapsulation resin in a cavity between a lower mold and an upper mold,
wherein the lower mold has a stepped portion provided in a bottom surface of the cavity below the inner lead,
a height of an upper surface of the stepped portion is larger than a height of an upper surface of the power semiconductor element disposed in the cavity, and
when the encapsulation resin is injected into the cavity, a lower surface of the metal plate is in contact with the bottom surface of the cavity, and the encapsulation resin is caused to flow downward from above the stepped portion toward the upper surface of the power semiconductor element.

2. The method of manufacturing a power semiconductor device of claim 1, wherein the lower mold includes a projection lower in height than the stepped portion and provided on the bottom surface of the cavity between the stepped portion and the metal plate.

3. The method of manufacturing a power semiconductor device of claim 1, wherein the lower mold includes a small stepped portion lower in height than the stepped portion and provided in the bottom surface of the cavity between the stepped portion and the metal plate.

4. The method of manufacturing a power semiconductor device of claim 1, wherein the stepped portion is provided along a longer side of the metal plate,
the lower mold includes a projection provided on a bottom surface of the cavity along a shorter side of the metal plate.

5. The method of manufacturing a power semiconductor device of claim 1, wherein the stepped portion is provided to surround a periphery of the metal plate.

6. A power semiconductor device comprising:
a lead frame having an inner lead, an outer lead connected to the inner lead, a die pad disposed at a position lower than that of the inner lead, and a bent portion connecting the inner lead and the die pad;
a power semiconductor element fixed on the die pad;
a metal plate bonded to a lower surface of the die pad via an insulating film; and
an encapsulation resin encapsulating the inner lead, the die pad, the power semiconductor element, the insulating film and metal plate,
wherein a lower surface of the metal plate is exposed from a lower surface of the encapsulation resin,
a stepped portion is provided in the lower surface of the encapsulation resin below the inner lead,
a height of the lower surface of the encapsulation resin in the stepped portion is larger than a height of an upper surface of the power semiconductor element, and
a small stepped portion shallower in depth than the stepped portion is provided in a lower surface of the encapsulation resin between the stepped portion and the metal plate.

7. A power semiconductor device comprising:
a lead frame having an inner lead, an outer lead connected to the inner lead, a die pad disposed at a position lower than that of the inner lead, and a bent portion connecting the inner lead and the die pad;
a power semiconductor element fixed on the die pad;
a metal plate bonded to a lower surface of the die pad via an insulating film; and
an encapsulation resin encapsulating the inner lead, the die pad, the power semiconductor element, the insulating film and metal plate,
wherein a lower surface of the metal plate is exposed from a lower surface of the encapsulation resin,
a stepped portion is provided in the lower surface of the encapsulation resin below the inner lead, and
a height of the lower surface of the encapsulation resin in the stepped portion is larger than a height of an upper surface of the power semiconductor element,
wherein a depression shallower in depth than the stepped portion is provided in a lower surface of the encapsulation resin between the stepped portion and the metal plate, and an upper surface of the depression is connected to the stepped portion.

8. The power semiconductor device of claim 7, wherein the depression includes two or more depressions.

9. The power semiconductor device of claim 6, wherein the stepped portion is provided along a longer side of the metal plate, and
a recess is provided in a lower surface of the encapsulation resin along a shorter side of the metal plate.

10. The power semiconductor device of claim 6, wherein the stepped portion is provided to surround a periphery of the metal plate.

11. The power semiconductor device of claim 6, comprising:
a slanting surface in the lower surface of the encapsulation resin that connects the stepped portion and the small stepped portion.

\* \* \* \* \*